(12) United States Patent
Lin et al.

(10) Patent No.: US 7,644,751 B2
(45) Date of Patent: Jan. 12, 2010

(54) CLIP FOR HEAT SINK

(75) Inventors: Tong-Hua Lin, Shenzhen (CN);
Chin-Lung Chen, Tu-Cheng (TW);
Jian-Qing Sheng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 616 days.

(21) Appl. No.: 11/309,253

(22) Filed: Jul. 20, 2006

(65) Prior Publication Data

US 2007/0079485 A1    Apr. 12, 2007

(30) Foreign Application Priority Data

Oct. 7, 2005    (CN) .................. 2005 1 0100204

(51) Int. Cl.
*H05K 7/20*    (2006.01)
(52) U.S. Cl. ..................... 165/80.3; 361/704
(58) Field of Classification Search ............... 165/80.3, 165/104.33, 185; 361/704, 710
See application file for complete search history.

(56) References Cited

U.S. PATENT DOCUMENTS 6,318,452 B1 *  11/2001  Lee ........................ 165/80.3
6,731,504 B1 *   5/2004  Liu ........................ 361/704
7,046,516 B2 *   5/2006  Lee et al. ................. 361/704
7,215,550 B1 *   5/2007  Yang et al. ............... 361/704
7,409,751 B2 *   8/2008  Chen et al. ................ 24/455
2004/0179340 A1 * 9/2004  Lin ........................ 361/704
2005/0111193 A1 * 5/2005  Lee et al. ................. 361/704
2006/0034057 A1 * 2/2006  Yang ....................... 361/704
2007/0044942 A1 * 3/2007  Mou ..................... 165/104.33

FOREIGN PATENT DOCUMENTS

TW    491370    8/2002
TW    560825    11/2003

* cited by examiner

*Primary Examiner*—Allen J Flanigan
(74) *Attorney, Agent, or Firm*—Frank R. Niranjan

(57) ABSTRACT

A heat sink clip (100) includes a spring member (10), a moveable locking member (20) and an actuating member (30). The spring member includes an elongated main body (11) and a first locking leg (14) connecting at one end of the main body. The locking member is coupled at the other end of the main body, including an engaging plate (22) and a second locking leg (26) extending from the engaging plate. The actuating member includes a handle (32) and an extension portion (34) formed at one end of the handle. The handle and the extension portion form an angle therebetween. The extension portion is operatively engageable with the engaging plate of the locking member.

10 Claims, 7 Drawing Sheets

CLIP FOR HEAT SINK

FIELD OF THE INVENTION

The present invention relates generally to clips, and more particularly to a clip used for securing a heat sink to a heat generating electronic component.

DESCRIPTION OF RELATED ART

It is well-known that heat is generated by electronic components such as central processing units (CPUs) of computers. If the generated heat is not rapidly and efficiently removed, the electronic component may overheat and the performance thereof may be significantly degraded. Generally, a heat dissipation device such as a heat sink is attached to the electronic component for a cooling purpose.

In order to attach the heat sink to the electronic component, a fastening device such as a clip is generally required. For example, Chinese Pat. No. 01227535.2 discloses a heat sink clip used for securing a heat sink to a CPU which is mounted on a socket. The socket defines first and second catches at opposite sides thereof. The heat sink clip includes a V-shaped spring member, and first and second locking legs respectively connected at two ends of the spring member. The first and second locking legs each define a mounting hole therein. An operational handle is connected at the second locking leg for manual operations.

In operation, the mounting hole of the first locking leg receives the first catch of the socket therein. Then, the operational handle is pushed downwardly to cause the mounting hole of the second locking leg to receive the second catch of the socket therein. However, when the operational handle is downwardly pushed, a large force is required to overcome the rigidity of the spring member. Furthermore, it is difficult to locate the mounting hole of the second locking leg with the second catch when the force is applied to the operational handle.

Therefore, it is desirable to provide a heat sink clip wherein one or more of the foregoing disadvantages may be overcome or at least alleviated.

SUMMARY OF THE INVENTION

The present invention relates, in one aspect, to a heat sink clip. According to an embodiment of the present invention, the clip includes a spring member, a locking member and an actuating member. The spring member includes an elongated main body and a first locking leg connecting at one end of the main body. The locking member is coupled at the other end of the main body and includes an engaging plate and a second locking leg extending from the engaging plate. The actuating member includes a handle and an extension portion formed at one end of the handle. The handle and the extension portion form an angle therebetween. The extension portion is operatively engageable with the engaging plate of the locking member.

The present invention relates, in another aspect, to a heat dissipation assembly. According to an embodiment of the present invention, the heat dissipation assembly includes a retention frame, a heat sink, and a clip for securing the heat sink to the retention frame. The retention frame has a first engaging unit formed at each of a pair of opposite sides thereof. The heat sink is located on the retention frame. The clip includes a spring member, a moveable locking member and an actuating member. The spring member includes a main body and a first locking leg extending downwardly from a first end of the main body. The moveable locking member is coupled at a second end of the spring member, including an engaging plate and a second locking leg extending from the engaging plate. The first and second locking legs each have a second engaging unit thereon. The actuating member includes a handle and an extension portion connected at one end of the handle. The handle and the extension portion form an angle therebetween. The extension portion is engageable with the engaging plate to cause the locking member to move with respect to the retention frame as the handle is operated from a first position to a second position. At the first position the second engaging units of the first and second locking legs loosely engage with the first engaging units of the retention frame. At the second position the second engaging units of the first and second locking legs firmly engage with the first engaging units of the retention frame.

Other advantages and novel features of the present invention will become more apparent from the following detailed description of preferred embodiment when taken in conjunction with the accompanying drawings, in which:

DETAILED DESCRIPTION OF THE INVENTION

Figure 1:
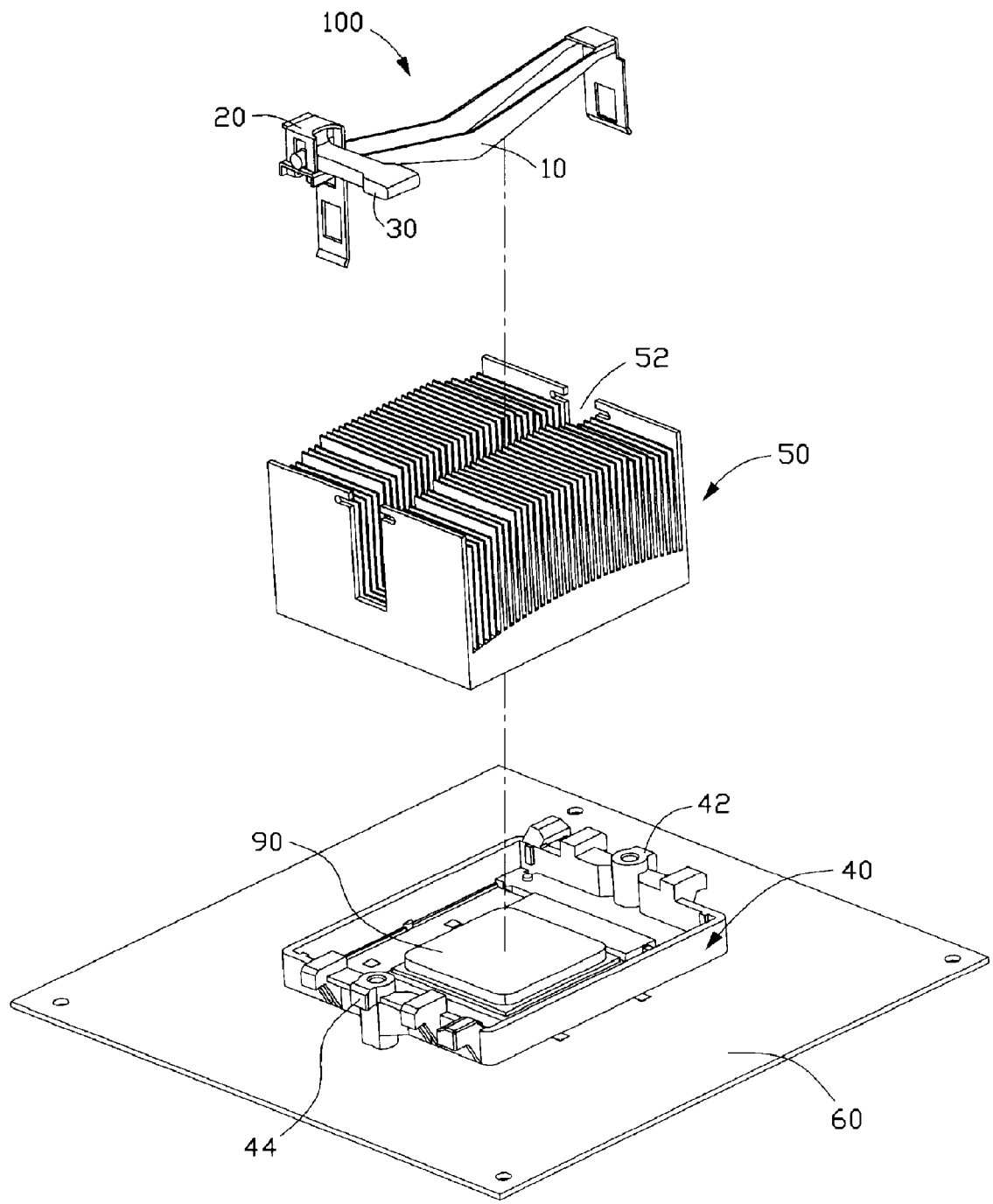
FIG. 1 is an exploded, isometric view of a heat dissipation assembly in accordance with an embodiment of the present invention.

FIG. 1 illustrates a clip 100 in accordance with an embodiment of the present invention, which is used to secure a heat sink 50 to a heat generating electronic component such as a central processing unit (CPU) 90. The CPU 90 is mounted on a circuit board 60 and is surrounded by a retention frame 40 which is mounted on the circuit board 60. The retention frame 40 is substantially square-shaped and has first and second catches 42, 44 respectively formed at a pair of opposite sides thereof. The heat sink 50 is made of highly thermally conductive material such as copper, aluminum, or their alloys. In this embodiment, the heat sink 50 is an extruded aluminum heat sink and defines an elongated locating groove 52 through a middle portion thereof.

Figure 2:
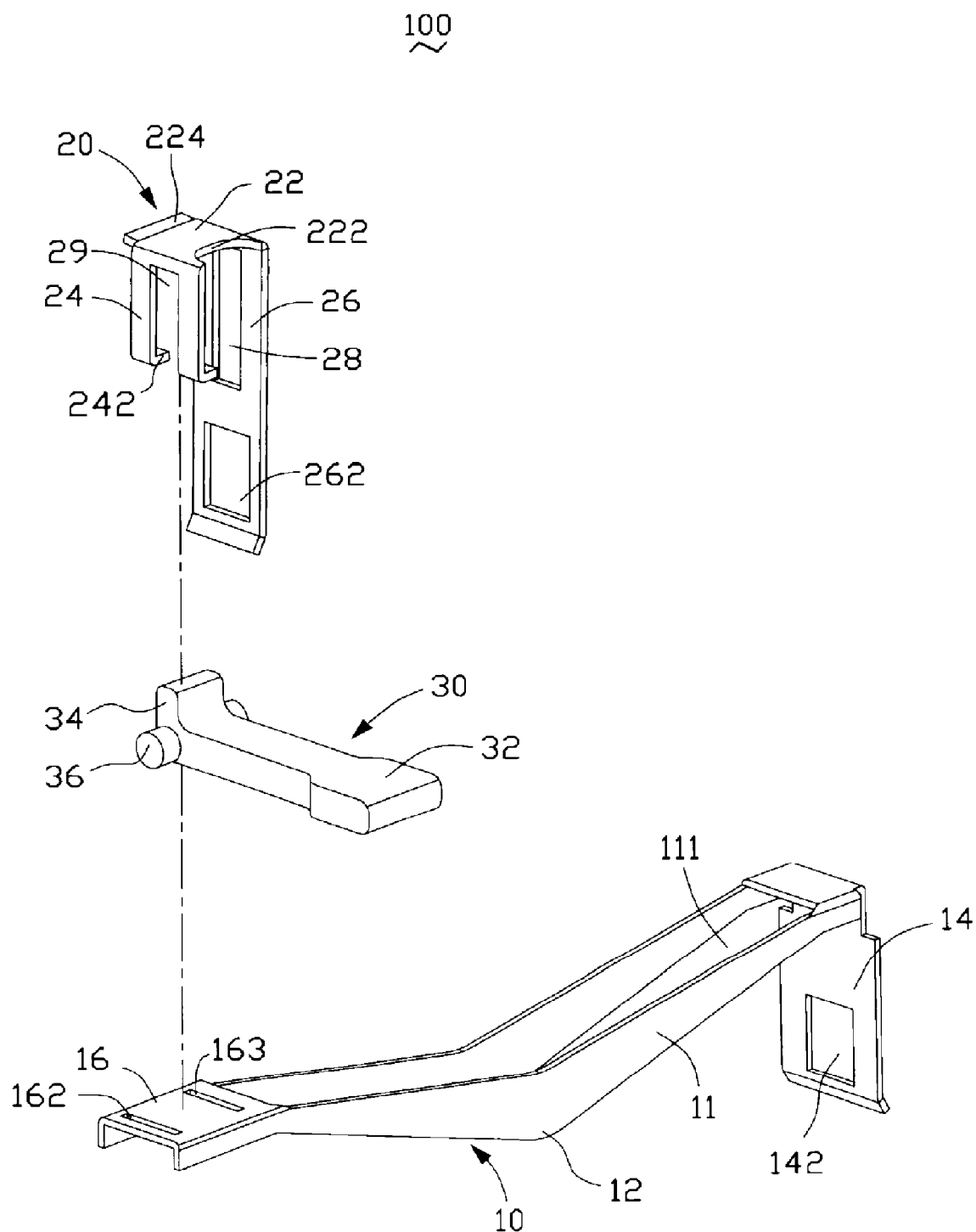
FIG. 2 is an exploded view of the clip of the heat dissipation assembly of FIG. 1.

With reference to FIG. 2, the clip 100 includes a spring member 10, a moveable locking member 20, and an actuating member 30.

The spring member 10, which is typically made of resilient metal material such as stainless steel, includes an elongated main body 11 and a first locking leg 14. The main body 11 defines an elongated cutout 111 therein for saving material and increasing resilience therefor. The main body 11 has a substantially V-shaped pressing portion 12 at a middle part thereof. The first locking leg 14 is integrally formed with and depends from a first end of the main body 11. In other words, the first locking leg 14 is monolithic with the main body 11. The first locking leg 14 defines a first mounting hole 142 near a bottom portion thereof. A flat connecting plane 16, through which first and second receiving slots 162, 163 are defined, is formed at the other end of the main body 11. The first and second receiving slots 162, 163 are spaced from each other.

The locking member 20 includes a flat engaging plate 22, a side plate 24 and a second locking leg 26. The second locking leg 26 and the side plate 24 depend from the engaging plate 22 from left and right side edges thereof, as viewed from FIG. 2. The engaging plate 22 defines a semi-circular cutout 222 at a front side edge thereof, and has a guiding tab 224 extending outwardly and slightly upwardly from a rear side edge thereof. The second locking leg 26 defines a second mounting hole 262 at a bottom portion thereof. A first elongated positioning slot 28 is defined at a top portion of the second locking leg 26. The side plate 24 is shorter than the second locking leg 26 and has a stopping tab 242 formed at a free end thereof. The stopping tab 242 extends perpendicularly and inwardly from the free end of the side plate 24 towards the second locking leg 26. The side plate 24 defines a second elongated positioning slot 29 therein, corresponding to the first elongated positioning slot 28.

The actuating member 30 is preferably made of plastic material, including a handle 32 and an extension portion 34 formed at one end of the handle 32. A pivot axle 36 is formed at a joint of the handle 32 and the extension portion 34 and extends laterally outwardly from the handle 32. The handle 32 and the extension portion 34 form an angle therebetween. The angle is preferably between 60° and 120°. Optimally, the angle is 90°, as shown in the present embodiment, whereby the handle 32 and the extension portion 34 cooperatively form an L-shaped profile.

Referring back to FIG. 1, the actuating member 30 is supported on the connecting plane 16 of the spring member 10 with the handle 32 of the actuating member 30 projecting laterally outwardly from the main body 11 of the spring member 10. The side plate 24 and the second locking leg 26 of the moveable locking member 20 are slideably received in the first and second receiving slots 162, 163, respectively. The engaging plate 22 of the locking member 20 is located above the connecting plane 16 while the bottom portion of the second locking leg 26 is located below the connecting plane 16. The extension portion 34 of the actuating member 30 is located between the connecting plane 16 and the engaging plate 22. Specifically, the extension portion 34 of the actuating member 30 is enclosed in a receiving space (not labeled) defined cooperatively by the locking member 20 and the connecting plane 16, while the pivot axle 36 of the actuating member 30 is positioned in the positioning slots 28, 29 of the locking member 20. The extension portion 34 is engageable with the engaging plate 22 as the actuating member 30 is operated, which will be discussed in detail later. The stopping tab 242 of the side plate 24 is used to stop the side plate 24 and accordingly the locking member 20 from sliding off from the receiving slots 162, 163 of the connecting plane 16.

Figure 3:
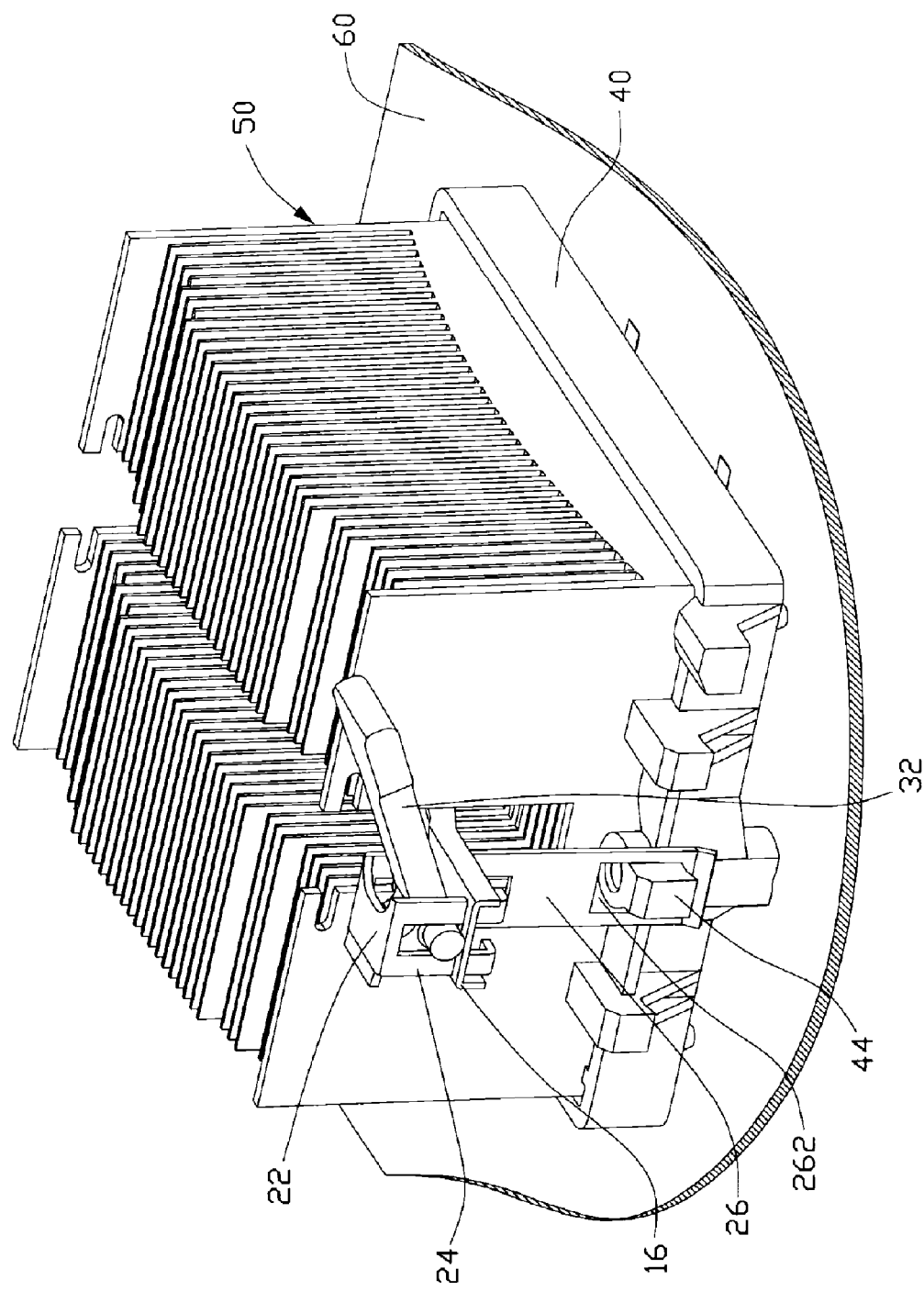
FIG. 3 is an assembled view of the heat dissipation assembly of FIG. 1.
Figure 4:
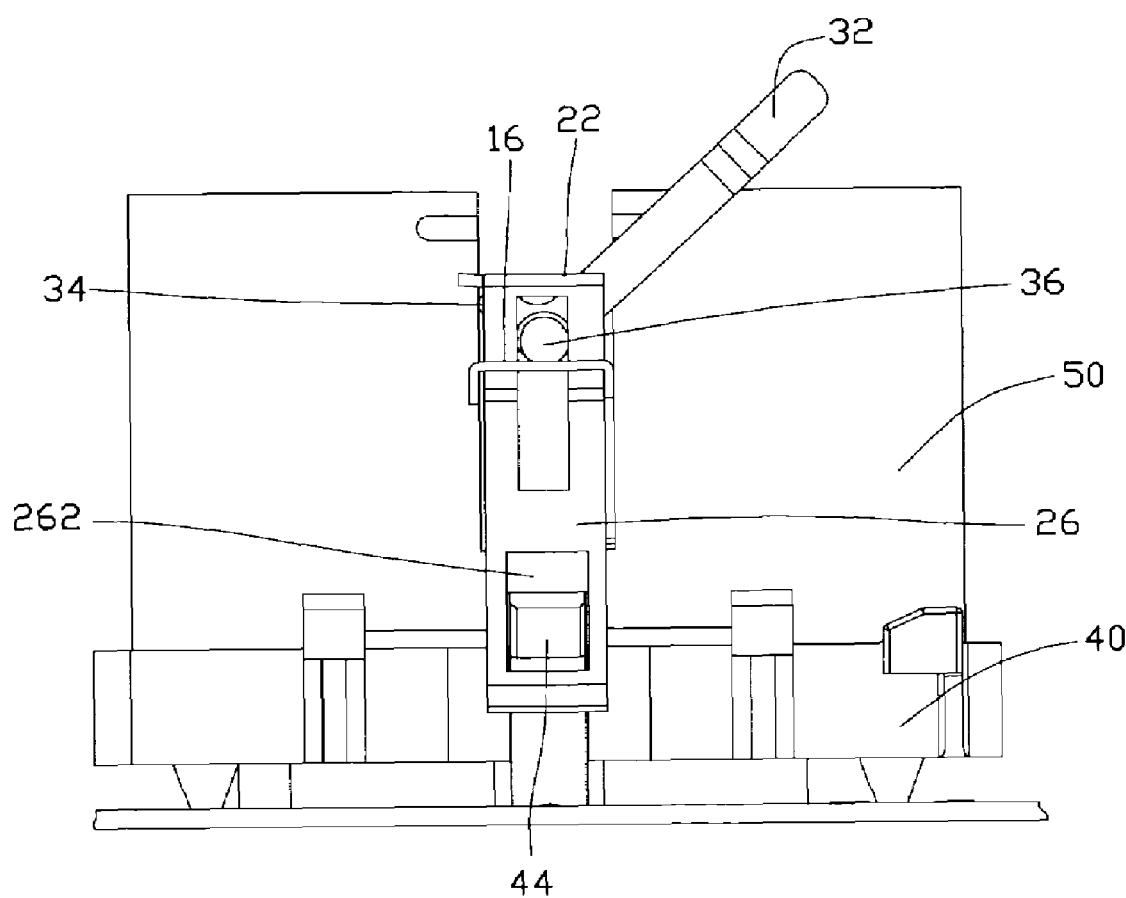
FIG. 4 is a side elevational view of the heat dissipation assembly of FIG. 3, with the clip being located at an unlocked position.
Figure 5:
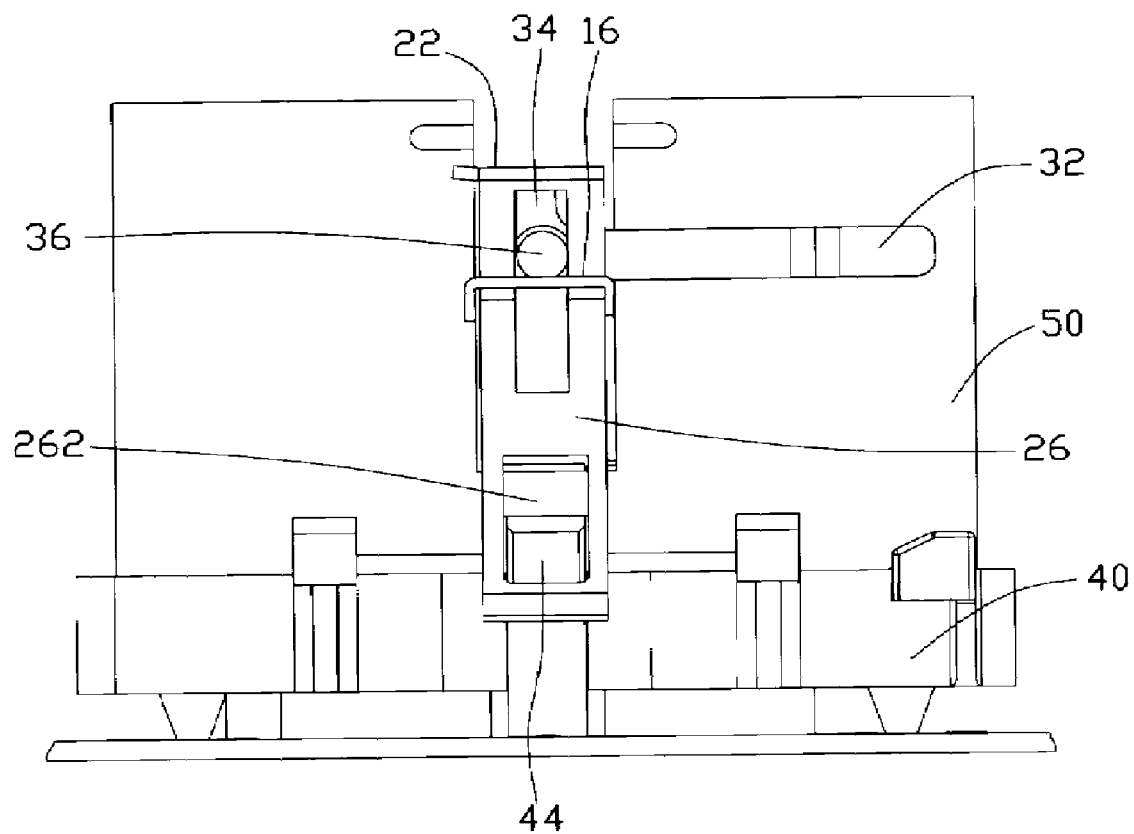
FIG. 5 is a side elevational view of the heat dissipation assembly of FIG. 3, with the clip being located at a locked position.

With reference now also to FIGS. 3-5, in operation, the main body 11 of the spring member 10 is placed in the locating groove 52 of the heat sink 50. The first and second mounting holes 142, 262 of the first and second locking legs 14, 26 loosely receive the first and second catches 42, 44 of the retention frame 50, respectively, as shown in FIG. 4. At this moment, the clip 100 is located in an unlocked position. The handle 32 of the actuating member 30 is received in the cutout 222 of the engaging plate 22 and is located aslant with respect to the connecting plane 16 of the spring member 10. The extension portion 34 of the actuating member 30 is located below the guiding tab 224 of the engaging plate 22.

Then, the handle 32 of the actuating member 30 is rotated in a clockwise direction, the extension portion 34 of the actuating member 30 is guided by the guiding tab 224 to enter into engagement with the engaging plate 22. As the handle 32 is further rotated with respect to the pivot axle 36, the extension portion 34 pushes the engaging plate 22, and accordingly the locking member 20, to move upwardly with respect to the retention frame 40. As a result, the first and second locking legs 14, 26 enter into engagement with the first and second catches 42, 44 of the retention frame 40, respectively. At this stage, the clip 100 is located at a locked position, as shown in FIG. 5. The handle 32 of the actuating member 30 is located horizontally laterally from the main body 11 of the spring member 10. The first and second mounting holes 142, 262 of the first and second locking legs 14, 26 firmly receive the first and second catches 42, 44 of the retention frame 40 therein, and at the same time, the pressing portion 12 of the spring member 10 exerts a downward pressing force on the heat sink 50 whereby the heat sink 50 is maintained in intimate thermal contact with the CPU 90 for dissipating heat generated thereby.

Figure 6:
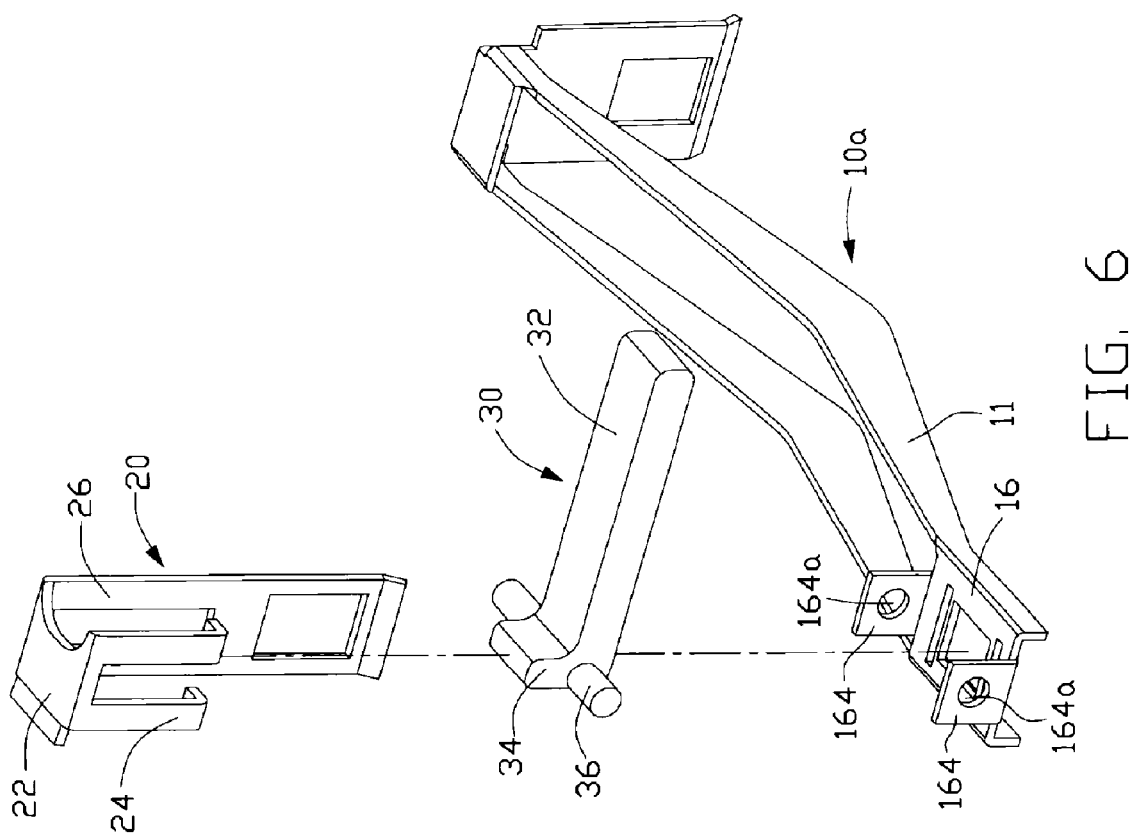
FIG. 6 is an exploded, isometric view of a clip in accordance with another embodiment of the present invention.
Figure 7:
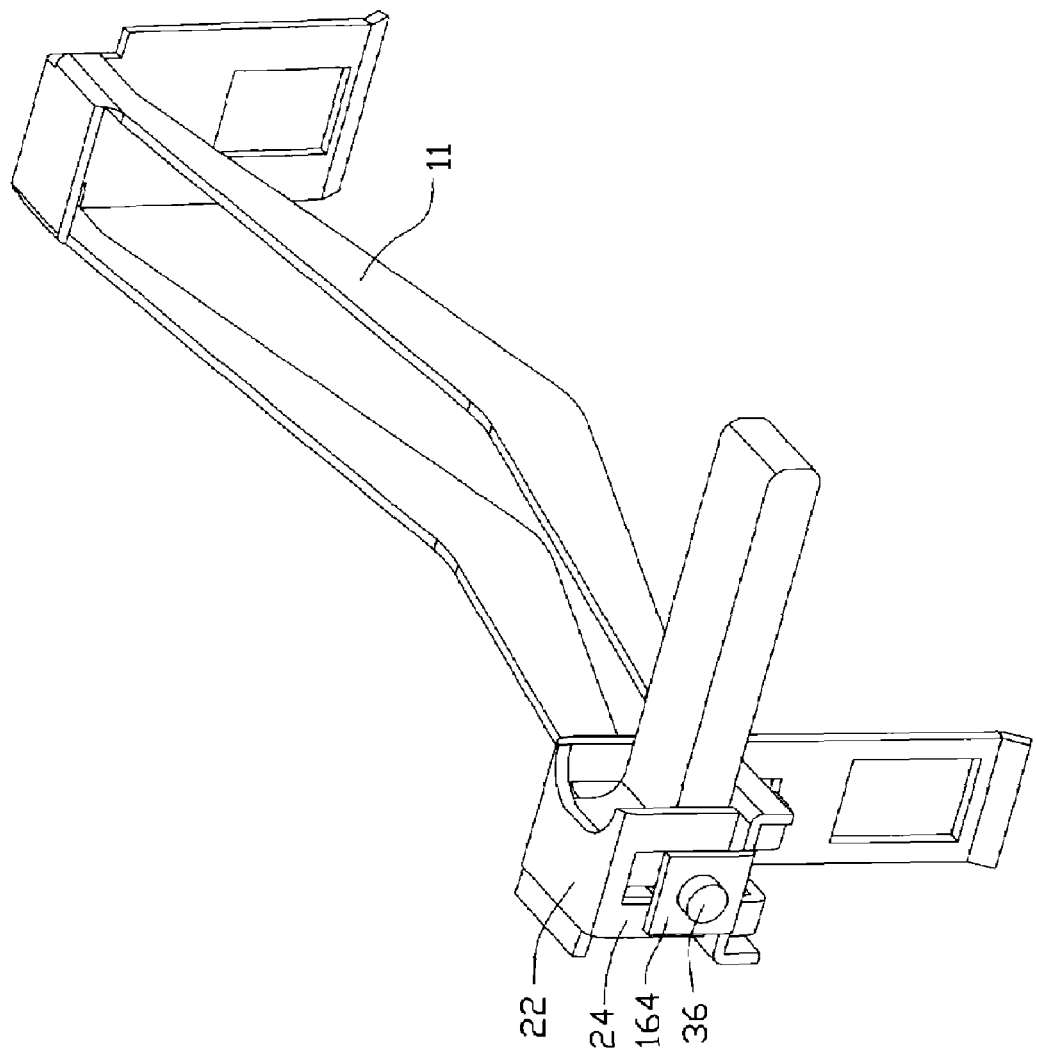
FIG. 7 is an assembled, isometric view of the clip of FIG. 6.

FIGS. 6-7 illustrate another embodiment of a clip in accordance with the present invention, in which the spring member 10a has a pair of connecting plates 164 extending upwardly from opposite sides of the connecting plane 16, respectively. The connecting plates 164 each define an aperture 164a for pivotably receiving the pivot axle 36 of the actuating member 30 therein. Other structures of this embodiment are the same as those of the embodiment shown in FIG. 2; thus, description thereof is omitted herein.

According to the present clip 100, it is convenient to secure the heat sink 50 to the CPU 90 since the handle 32 of the actuating member 30 can be easily operated by hand, without requiring a large force.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink clip, comprising:
a spring member including an elongated main body, a first locking leg connecting at one end of the main body;
a locking member coupled at an other end of the main body, including an engaging plate and a second locking leg extending from the engaging plate; and
an actuating member including a handle and an extension portion formed at one end of the handle, the handle and the extension portion forming an angle therebetween, the extension portion being operatively engageable with the engaging plate of the locking member;
wherein a connecting plane is formed at the other end of the main body, the connecting plane defining a slot therein, the second locking leg being slideably received in the slot of the connecting plane;
wherein the engaging plate is located above the connecting plane, the extension portion of the actuating member being located between the connecting plane and the engaging plate, the second locking leg extending downwardly from the engaging plate; and wherein a slot is defined at a top portion of the second locking leg, and a pivot axle is formed at a joint of the handle and the extension portion of the actuating member, the pivot axle being received in the slot of the second locking leg.

2. The heat sink clip of claim 1, wherein the first locking leg is monolithic with the main body and the main body includes a V-shaped pressing portion at a middle part thereof.

3. The heat sink clip of claim 1, wherein the angle is substantially 90°.

4. The heat sink clip of claim 1, wherein the actuating member is supported on the connecting plane, and the handle of the actuating member projects laterally outwardly from the main body of the spring member.

5. The heat sink clip of claim 1, wherein the spring member has a pair of spaced connecting plates extending from the connecting plane, the connecting plates each defining an aperture therein, the pivot axle being pivotably received in the aperture.

6. The heat sink clip of claim 1, wherein the locking member further includes a side plate extending from the engaging plate, the connecting plane defining an additional slot therein, the side plate being slideably received in the additional slot.

7. The heat sink clip of claim 6, wherein the side plate is shorter than the second locking leg and has a stopping tab formed at a free end thereof for preventing the locking member from separating from the connecting plane.

8. A clip for a heat sink comprising:
   a V-shaped elongated body having a first end and a second end;
   a first locking leg extending downwardly from the first end of the elongated body for engaging with a first catch;
   a locking member vertically slideably mounted on the second end of the elongated body, having a second locking leg extending downwardly from the second end of the elongated body for engaging with a second catch; and
   an actuating member sandwiched between the second end of the elongated body and a top engaging plate of the locking member, having an L-shaped profile with a vertically oriented extension portion and a horizontally extended handle portion, and pivotably movable between a first position and a second position by operating the handle portion thereof, wherein at the second position, the vertically oriented extension portion of the actuating member pushes upwardly the top engaging plate of the locking member to cause the first and second locking legs to have a secure engagement with the first and second catches.

9. The clip of claim 8, wherein the second end of the elongated body has two spaced, upwardly extending connecting plates formed thereon, the actuating member having a pivot axle located below the vertically extended extension portion and pivotably connecting with the two connecting plates.

10. A heat sink clip, comprising:
   a spring member including an elongated main body, a first locking leg connecting at one end of the main body;
   a locking member coupled at an other end of the main body, including an engaging plate and a second locking leg extending from the engaging plate; and
   an actuating member including a handle and an extension portion formed at one end of the handle, the handle and the extension portion forming an angle therebetween, the extension portion being operatively engageable with the engaging plate of the locking member;
   wherein a connecting plane is formed at the other end of the main body, the connecting plane defining a slot therein, the second locking leg being slideably received in the slot of the connecting plane;
   wherein the locking member further includes a side plate extending from the engaging plate, the connecting plane defining an additional slot therein, the side plate being slideably received in the additional slot; and
   wherein the side plate is shorter than the second locking leg and has a stopping tab formed at a free end thereof for preventing the locking member from separating from the connecting plane.

* * * * *

UNITED STATES PATENT AND TRADEMARK OFFICE
CERTIFICATE OF CORRECTION

PATENT NO. : 7,644,751 B2
APPLICATION NO. : 11/309253
DATED : January 12, 2010
INVENTOR(S) : Lin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 792 days.

Signed and Sealed this

Sixteenth Day of November, 2010

David J. Kappos
*Director of the United States Patent and Trademark Office*